United States Patent [19]

Huddleston et al.

[11] Patent Number: 5,099,348
[45] Date of Patent: * Mar. 24, 1992

[54] DISPLAY FOR REMOTE RECEIVER IN A UTILITY MANAGEMENT SYSTEM

[75] Inventors: Paul M. Huddleston, Stone Mountain; Glenn A. Davis, Lilburn, both of Ga.

[73] Assignee: Scientific-Atlanta, Inc., Atlanta, Ga.

[*] Notice: The portion of the term of this patent subsequent to Oct. 25, 2005 has been disclaimed.

[21] Appl. No.: 237,393

[22] Filed: Aug. 24, 1988

Related U.S. Application Data

[63] Continuation-in-part of Ser. No. 790,872, Oct. 24, 1985, Pat. No. 4,780,910, which is a continuation-in-part of Ser. No. 680,742, Dec. 12, 1984, abandoned.

[51] Int. Cl.$^5$ .............................. H04B 10/21
[52] U.S. Cl. ................................ 359/143
[58] Field of Search ............... 455/606, 607, 603, 608, 455/617; 340/825.54; 359/143

[56] References Cited

U.S. PATENT DOCUMENTS

| | | | |
|---|---|---|---|
| 4,161,651 | 7/1979 | Sano | 455/612 |
| 4,213,119 | 7/1980 | Ward | 455/613 |
| 4,276,656 | 6/1981 | Petryk | 455/612 |
| 4,298,839 | 11/1981 | Johnston | 455/602 |
| 4,346,478 | 8/1982 | Sichling | 455/612 |
| 4,449,244 | 5/1984 | Kopainsky | 455/607 |
| 4,764,981 | 8/1988 | Miyahara | 455/603 |
| 4,780,910 | 10/1988 | Huddleston | 455/617 |
| 4,809,257 | 2/1989 | Ganenbein | 370/4 |

FOREIGN PATENT DOCUMENTS

| | | | |
|---|---|---|---|
| 0180423 | 5/1986 | European Pat. Off. | 455/603 |
| 0246132 | 12/1985 | Japan | 455/603 |
| 0231587 | 10/1987 | Japan | 455/603 |
| 2182180 | 5/1987 | United Kingdom | 455/603 |
| 2204426 | 11/1988 | United Kingdom | 455/603 |

*Primary Examiner*—Curtis Kuntz
*Assistant Examiner*—L. Pascal
*Attorney, Agent, or Firm*—Jones, Askew & Lunsford

[57] ABSTRACT

A method and apparatus for monitoring and testing the operation and configuration of a remote receiver in a utility management system, such as a load management system or a cable television subscriber control system. The receivers are responsive to encoded command signals to perform utility control functions such as remove electrical loads from the electrical distribution system or connect a subscriber to the CATV system. The receiver retrieves status information pertaining to the receiver, and transmits the status information over a data communications link to a hand-held operator display unit. The operator display unit receives the transmitted status information, and displays the received status information to the operator on a display.

43 Claims, 7 Drawing Sheets

DISPLAY FOR REMOTE RECEIVER IN A UTILITY MANAGEMENT SYSTEM

CROSS REFERENCE TO RELATED APPLICATIONS

This application is a continuation-in-part of application Ser. No. 06/790,872, filed Oct. 24, 1985, now U.S. Pat. No. 4,780,910, patent on Oct. 25, 1988, which is a continuation-in-part of application Ser. No. 680,742, filed Dec. 12, 1984, now abandoned.

TECHNICAL FIELD

The present invention relates generally to utility management systems, and more particularly it relates to an improved status display for a remote receiver for controlling an electrical load in an electrical load management system or for controlling a subscriber control unit in a cable television (CATV) system.

BACKGROUND

Utility management systems, for example electrical load management systems for allowing an electrical utility to control the load on the electrical system, are known in the art. These systems operate to divert energy requirements to minimize electrical blackouts or "brown-outs". For example, U.S. Pat. No. 4,190,800 to Kelly, Jr. et al., entitled "Electrical Load Management System", assigned to the same assignee as the present invention, discloses an electrical load management system wherein a central station monitors the use of electrical power, and when peak demand periods occur, transmits coded information by radio from a central station to remote receivers mounted proximate the electrical loads. In this patent, the transmitted signal includes address and command information which is decoded at the receivers. Receivers which have been addressed pass command information over the distribution lines to the electrical loads, and thereby controls the operation of the customers' power consuming devices.

Other load management systems employ separate radio receivers at each customer's location, rather than providing a receiver at the distribution transformer as in the aforementioned U.S. patent. Examples of this type system include the types DCU-1120, -1170, -1180, and -1190 utility radio switches manufactured by Scientific-Atlanta, Inc., Atlanta, Ga., and the type REMS-100 radio switch manufactured by General Electric, King of Prussia, Pennsylvania. These systems incorporate an FM receiver which can receive a transmittal up to about 25 miles from a transmitter site. The transmitter issues commands to temporarily remove power from a selected load. This self-contained receiver is typically mounted on or immediately adjacent to the electrical loads under control, and receives its power from the line that feeds the controlled loads. Switches, jumpers, or other means contained within the receiver configure the receiver to respond only to a particular address or set of addresses, so that different geographical areas, types of appliances, or numbers of consumers may be separately controlled.

A particular problem with these separate remotely-controllable radio switches for electrical load management, as well as with other types of utility management receivers such as subscriber control units for CATV systems, is testing of individual receivers for responsiveness. In particular, for effective load management, the utility must develop a high degree of certainty that selected electrical loads will be removed when the commands are transmitted. If certain receivers are malfunctioning or are located in fringe reception areas wherein command signals may not reliably reach the receivers, there will be uncertainty whether a given command to reduce a load in an emergency situation will remove enough of the load to prevent a brown-out or other potentially more serious power interruption.

In the above-described General Electric REMS-100 radio switch, an optional light-emitting diode (LED) is provided for test purposes. The receiver is responsive to receipt of a particular transmitted test command to illuminate the LED, and as meters are manually read by the utility, the LED can be checked. This test function allows a check of correct wiring of the receiver, correct operation of the receiver, and a check on the radio signal, and remains on indefinitely until commanded off or until loss of power, and provides no other indicating function.

A hand-held transmitter may be used for testing these receivers, but verifying the correct and reliable operation of the receiver requires a check of the system signal propagation properties. Thus, sending test signals from the central utility transmitter, with the response indicated at each receiver site, is preferable for testing. However, the REMS-100 receiver only has one indicator light for a one-time test which is verified later by the utility. There is also no provision for testing any function other than correct wiring and simple yes-or-no one-time receipt of the particular test command by the receiver.

The particular REMS-100 load reduction receiver described above does, however, include a built-in volatile memory for maintaining an on-going record of valid messages received. This record is reset to zero by a particular predetermined incoming radio message, or upon power loss and restoration. Statistical data related to the number of load shedding commands provided to a particular receiver may be counted and retained in the volatile memory. This information is valuable in evaluating system performance, fringe area performance, and expansion coverage. However, the counting of the stored messages in the volatile memory entails opening of the receiver enclosure and placing an external probe on certain pins of the internal memory counter. Opening of the unit requires removal of the utility security tags or seals, and results in inconvenience to meter readers who must first remove the security tag, open the enclosure, connect a reading device to the memory, remove the connector after reading the memory contents, close the enclosure, and replace the security tag. In addition to risking the integrity of the circuitry by manual placement of a probe onto the pins of the circuits, this procedure involves the expenditure of a great amount of time, effort, and money in opening the box, reading the memory counter, and replacing the security tag or seal.

Other types of utilities, for example cable television (CATV) distribution systems, also experience problems in testing the utility management receivers, for example subscriber control units, for responsiveness or for operability. While these CATV systems typically possess certain limited communications capabilities, it is often impossible to precisely determine information about the operation of the subscriber control unit. For example, it is desirable to monitor whether or not the subscriber control unit is operating, whether it is connected or disconnected, how many subscriber modules are connected, whether the jamming oscillators provided therein for preventing receipt of undesired programming is operative, the status of premium programming, the status of power to the unit if the unit is home powered, or the security alarm status. Without physically inspecting the unit, and in some instances physically opening the enclosure to inspect the state of components or of connections therein, the above-mentioned and other types of status information is not obtainable in prior art CATV systems.

Since many off-premise subscriber control units are mounted on utility poles, there are also concerns for the safety of CATV maintenance and installation personnel who must climb the poles to inspect the units, as well as concerns over the productivity levels for CATV personnel who must perform system audits by visiting sites. Productivity is affected by factors such as weather and the need to provide a specialized bucket truck to allow access to the subscriber control unit.

Accordingly, there is a need for a method of testing or monitoring utility management system receivers quickly and inexpensively and without inconvenient procedures such as breaking security tags or seals, risking the physical integrity of the circuitry, climbing poles, using bucket trucks, or adding costly or complex circuit components into the receiver.

While data displays are known in the art, and could easily be provided at each receiver for displaying more comprehensive testing information, complex data displays such as digital LED or liquid-crystal information displays are expensive and would require modifying the receiver enclosure so that the data display could be viewed from the exterior of the receiver enclosure.

SUMMARY OF THE INVENTION

The present invention overcomes these and other problems in monitoring and testing prior art utility management systems receivers by providing an improved method and apparatus for testing and monitoring the operation and configuration of such receivers. In the preferred method and embodiment, a utility employee such as a meter reader uses a hand-held display unit to display operational and testing data which is transmitted via an optical data link from the utility receiver. Advantageously, one embodiment of the present invention utilizes a preexisting light-emitting display at the receiver for communicating more extensive data concerning the testing and operational parameters of a receiver to the hand-held display unit, which displays the information to an operator.

In another embodiment, a preexisting local oscillator in the receiver circuitry is modified to take advantage of the stray RF transmissions provided by the oscillator. The data is transmitted via an RF radio link from the receiver to the hand-held unit by modulating the local oscillator in the receiver.

Briefly described, the present invention comprises an improved status display method and apparatus for a utility management system receiver. An internal memory of the receiver control microcomputer is employed to store status data related to a plurality of parameters of operation or testing of the receiver. In one embodiment, a predetermined status inquiry command signal transmitted from a hand-held display unit causes the receiver to retrieve the stored status data from the memory. The retrieved status data is then formatted into a communications format for a data link, and transmitted via the receivers's light-emitting display or RF oscillator.

A transportable hand-held display and transmitter unit is responsive to receive the transmitted status data, and to convert this received status data into a form readable by an operator of the hand-held unit.

Advantageously, the receiver in one embodiment of the present invention allows the retrieval and display of status data without breaking or removing the utility security seal or tag, since the data is transmitted through the preexisting light emitting devices, whose original function was only to provide an indication of the current status of the radio switch, or through a preexisting local RF oscillator, whose original function was only to aid in the demodulation of signals transmitted to the receiver.

More particularly described, the present invention comprises a display unit including a transmitter for transmitting a coded command signal having address and command information to a load management receiver. Each of the receivers includes means for decoding the command and address signals, and is responsive to the decoded command signals for carrying out a utility function such as removing an electrical load from the electrical distribution system or disconnecting a CATV subscriber. A memory in each of the receivers stores data related to the operation of the receiver, for example, the number of transmissions of a predetermined test command signal from the utility central transmitter, the time elapsed since power loss or receipt of a predetermined reset command, the number of load control functions commanded and provided by the receiver within a predetermined time period, the number of channels being scrambled, whether a security breach has occurred, the number of subscriber modules present, equipment failures, connect/disconnect status of subscribers, information on pay per view/impulse pay per view (PPV/IPPV), or the status of the home power supply.

In addition, information concerning the configuration of the receiver is provided in the disclosed embodiment for display to the operator of the hand-held display unit. For example, programmed address information, cold load pick up information, relay time out periods, and other programmed parameters are stored and transmitted to the display unit so that the operator can observe the coded address for the particular receiver being tested, the sequence of function provisions for a cold load pick up, and the delay time period before reconnection of a given load to the distribution system.

In one embodiment, a predetermined status inquiry command signal from the display unit causes the receiver to retrieve the status data from the memory, and transmit the retrieved status data in a predetermined communications format either on the light-emitting display or via the "transmitter" of the modified RF oscillator. In the preferred embodiment, the retrieved status data is automatically and/or repetitively transmitted. Preferably, in applications where the status inquiry command is employed, the display unit is small and transportable, and transmits the status inquiry command signal at low power so as to stimulate only a single, near-by receiver. An optically responsive circuit or an RF receiver tuned to the frequency of the modified local oscillator is provided in the display unit for receiving the optically transmitted status data from the receiver. The received status data is then converted to a format for display to the operator of the transportable unit. In the preferred embodiment, the optically responsive element on the transportable display unit is engaged with the light-emitting display on the receiver to receive the transmitted status data within an extremely short period of time, typically less than ½ second.

Accordingly, it is an object of the present invention to provide an improved utility management receiver monitoring and testing method.

It is another object of the present invention to provide a utility management system testing method which does not require breaking or removal of the utility security tags or seals at the sites of utility management receivers, climbing poles, or using bucket trucks.

It is another object of the present invention to provide an improved utility management receiver testing system which allows the display of more detailed information pertaining to the operation and configuration of the receiver.

It is another object of the present invention to provide a method for testing a utility management receiver which does not require any physical modifications to the enclosure of the receiver, or the addition of expensive data display devices at each receiver.

It is another object of the present invention to provide a system for testing a load management receiver which allows the monitoring of a greater number of parameters of operation of the receiver than prior art methods, such as the number of operations of particular control functions, the number of test functions, elapsed time, and configuration information.

It is another object of the present invention to provide a method and apparatus for testing the operation of a subscriber control unit in a CATV system which transmits status information about the operation of connected subscriber modules, such as whether or not the subscriber control unit is operative, the connect/disconnect status of each of a plurality of subscriber modules connected to the subscriber control unit, the status of jamming oscillators, the status of premium programming or pay per view configuration, home power status if the subscriber control unit is home powered, or security alarm status.

It is another object of the present invention to provide a method and apparatus for improving the monitoring and testing of utility management systems by allowing greater productivity for utility personnel by obviating pole climbing and the use of bucket trucks.

These and other objects, features, and advantages of the present invention may be more clearly understood and appreciated from a review of the following detailed description of the disclosed embodiment and by reference to the appended drawings and claims.

DETAILED DESCRIPTION OF THE PREFERRED EMBODIMENT

Figure 1:
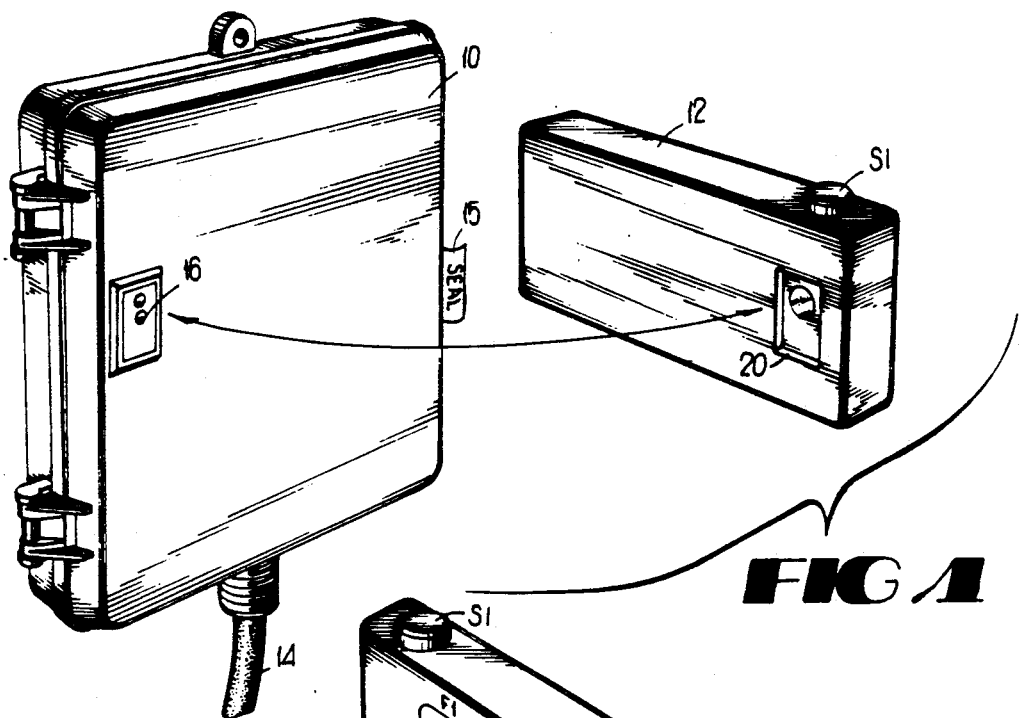
FIG. 1 illustrates a preferred embodiment of a portable transmitter and display unit and its use with a preferred embodiment of the load management receiver of the present invention.

Referring now to the drawings, in which like numerals indicate like elements throughout the several figures, FIG. 1 illustrates an electrical utility load management radio switch or receiver 10 constructed in accordance with a first embodiment of the present invention, and a hand-held transportable display unit 12 for stimulating the receiver 10 to retrieve data pertaining to the operation of the receiver. In the preferred embodiments, the receiver 10 is a type DCU-1120, -1170, -1180, or -1190 radio switch manufactured by Scientific-Atlanta, Inc., whose microcomputer program has been modified as disclosed herein. Those skilled in the art will understand that this type load management receiver includes a highly sensitive FM radio receiver 32 (FIG. 3) which can receive a radio transmittal up to 25 miles or more from a transmitter site. Typically, the receiver 10 is connected via wires 14 to the utility electrical power distribution system and to various electrical loads at a customer site.

The radio switch 10 is configurable to control up to four different electrically separate loads by a plurality of control means such as relays or triac switches, so that different types of loads at the consumer's location can be controlled. For example, air conditioners and other types of loads considered non-essential may be controlled by one relay, while more essential electrical service for refrigerators and the like may be controlled by another circuit. These four controlled loads are frequently referred to as "control functions".

An electrical utility typically provides a security seal or tag 15 to discourage and monitor tampering. The preferred receiver 10 includes an internal memory counter for maintaining a record of messages received. In the prior art, in order to read the contents of this memory, the security tag 15 must be removed, and unit opened to reveal a connector (not shown). An external probe is placed on the connector to read the memory contents. Needless to say, it is undesirable to require removal and replacement of the security tag in order to monitor and test the operation of the receiver 10.

The receiver 10 shown in FIG. 1 further includes a light-emitting diode (LED) display 16 as an indicator of operation. In the usual configuration, a red LED is provided as an indication of provision of control function #1. Optionally, a green LED is provided in the receiver for purposes of indicating a "PROP CHECK" test function. The PROP CHECK function consists of an individual, group, or all-call (scram) address plus a test function command. The green test function LED lights without any load shedding occurring, and merely provides an indication that a particular predetermined command has been transmitted and correctly received and decoded by the receiver. Typically, a single message is transmitted by the utility on a certain day. As customer meters are manually read by the utility, the PROP CHECK LED is checked for illumination. If the light is illuminated, it is an indication that the particular receiver being checked has been correctly wired, and is correctly operating to receive commands via the radio link.

In the first preferred embodiment of the present invention, the LED 16 is employed to optically transmit data pertaining to the operation of the receiver to the hand-held display unit 12.

Still referring to FIG. 1, the display unit 12, seen from the rear, comprises an optical receiver 20 which is operatively positioned over the LED 16 when it is desired to read the status data from the receiver. A push button S1 on the top of the display unit 12 actuates a low-power transmitter contained within the display unit to provide a predetermined status inquiry command radio signal to the receiver, which is then responsive to retrieve stored status data and modulate the data to the LED 16. The light from the LED is received by the optical receiver 20, and then displayed to the operator of the display unit 12.

Figure 2:
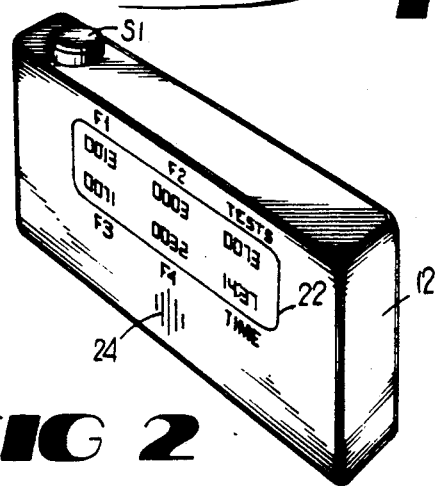
FIG. 2 illustrates the front of the transportable transmitter and display unit shown in FIG. 1.

Referring now to FIG. 2, the front of the hand-held display unit 12 is illustrated. The display unit includes a digital data display 22 for displaying the information received from the receiver 10. Although it will be understood that other types of status data may be provided, in the disclosed embodiment, the parameters of operation tested and monitored include the number of operations of each of the four control functions, designated F1 through F4, the number of test signals received, and the elapsed time since power loss or reset. It will be understood that while more or fewer parameters may be monitored, such as more or fewer functions may be provided or tested by a receiver, the preferred receiver employed in the disclosed embodiment provides four control functions, thereby allowing the removal or shedding of four different circuits from the electrical distribution system. Thus, it will be appreciated that the data display 22 displays in digital Arabic numerals the number of operations of each of the four control functions (F1-F4), the number of test signals received (TESTS), and the elapsed time (TIME) since power loss or reset, in one consolidated, easy-to-read format. It will thus be appreciated that a utility meter reader or other operator can retrieve the status data of a particular customer's receiver at the time the customer's meter is read, and the recorded status data compared to the number of function control commands or test commands provided by the main utility transmitter, so that a more comprehensive monitoring of the operation of the utility load management system may be accomplished.

In addition, it is specifically contemplated that information concerning the configuration of the receiver being addressed may also be provided for display to the operator of the hand-held display unit. By causing a receiver to provide information about the configuration of itself for display on the display unit, a meter reader or other operator can examine the particular functional aspects of the receiver noninvasively. For example, programmed address information, cold load pick up information, relay time out periods, and other programmed parameters related to the receiver configuration may be stored and transmitted to the display unit. This allows the operator to observe, respectively, the radio address code for the particular receiver being tested, the sequence of function provisions for a cold load pick up, and the delay time period before reconnection of a given load to the distribution system after disconnection. This configuration information may be displayed on the data display 22 either by time multiplexing in the predetermined display areas labelled "F1" through "F4", "TESTS", and "TIME" in FIGS. 2 or 3 or, alternatively, by providing a larger data display with more area for display of information.

The display unit 12 further includes an audible buzzer or beeper 24 for providing an audible signal to the operator, which will be described in greater detail below.

Figure 3:
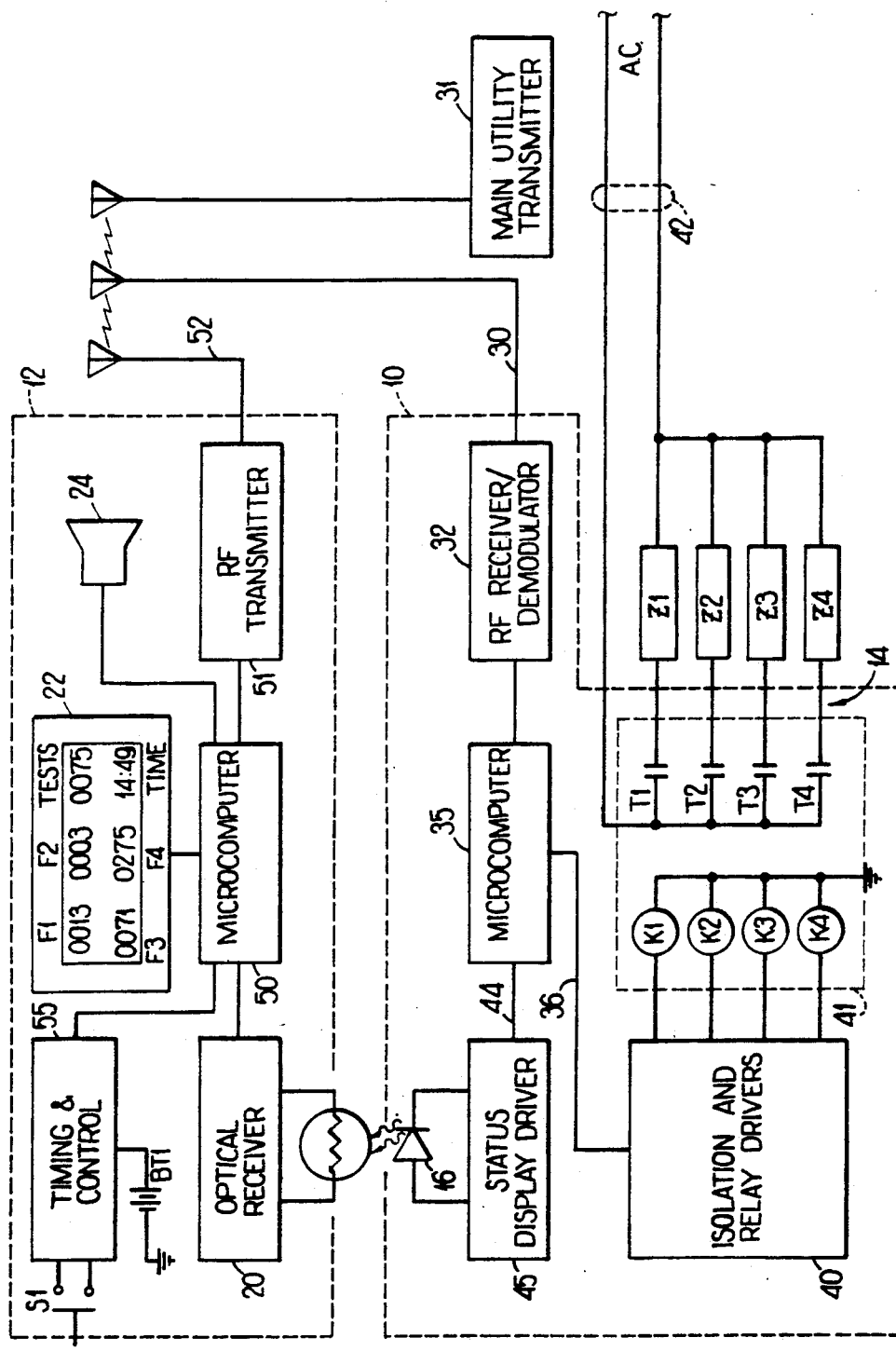
FIG. 3 is a block schematic diagram of a load management system constructed in accordance with the preferred embodiment of the present invention.

Referring now to FIG. 3, the disclosed embodiments of the load management system receiver 10 and the transportable display unit 12 will be described. The receiver 10 comprises an antenna 30 for receiving transmitted radio messages from a main utility transmitter 31. The structure and operation of an exemplary electrical load management system comprising a utility transmitter and a plurality of receivers for receiving coded information by radio from the main utility transmitter is shown in U.S. Pat. No. 4,190,800 to Kelly, Jr. et al., assigned to the same assignee as the present invention, the disclosure of which is incorporated herein by reference and made a part hereof. As described in this patent, the transmitted signal from the main utility transmitter 31 includes both address and command information which is decoded at each of the receivers. Those receivers which have been addressed utilize the command information to selectively remove electrical loads from the distribution system. The address information informs the customer of the existence of a peak load condition and/or controls the operation of the power consuming devices and/or electric meter connected to the receiver.

In the preferred embodiment of the present invention, as illustrated in FIG. 3, a radio frequency (RF) receiver/demodulator 32 receives the radio frequency command signal from the antenna 30 and is responsive to demodulate the transmitted command signals and provide the demodulated signals to a microcomputer 35. The microcomputer 35 is programmed to respond to command signals for the particular address for the particular receiver to provide the commanded control function. The microcomputer 35 provides control signals over lines 36 to an isolation and relay driver circuit 40, which drives the coils K1-K4 of a relay circuit 41. As will be understood by those skilled in the art, actuating the coils K1-K4 of the relay circuit 41 trips the contacts T1-T4, respectively, of the relay to connect or disconnect electrical loads Z1-Z4, respectively, from the AC electrical power distribution lines 42. Although not shown in FIG. 3, it will be understood that power for the receiver 10 may be drawn by a transformer connected in parallel to the AC lines 42.

Microcomputer 35 also provides a control signal on line 44 to a status display driver circuit 45, which controls the illumination of LED 16. As described above, the receiver 10 is operative to illuminate the LED to provide an indication that a control function is being provided (typically function #1, indicating actuation of relay contacts T1), or to illuminate an optional separate LED as an indication of receipt of the PROP CHECK test function.

Also illustrated in FIG. 3 in block diagram form are the components of the transportable display unit 12. The preferred embodiment of the display unit 12 comprises a microcomputer 50 as the central controller of the display unit. The microcomputer is connected to a low power FM radio frequency transmitter 51, which drives an antenna 52. Such FM transmitter circuits are known in the art, and will not be described further herein. However, it should be understood that the transmitter 51 employed in the disclosed embodiment is operative to transmit a predetermined status inquiry command signal at low power, in order to ensure that the display unit 12 only triggers display of the status information from a receiver in close proximity. Those skilled in the art and familiar with the structure of the preferred receiver 10 will understand that the "status inquiry" command optimally comprises a signal such as the "all call" or "scram" address plus a particular predetermined test function code.

The microcomputer 50 is further operative to control the data display 22. In the preferred embodiment, the data display 22 comprises a type LM016 liquid crystal display (LCD) manufactured by Hitachi America, Ltd., San Jose, Calif. Those skilled in the art will understand that this type LCD display includes electronics which enable it to receive data in parallel eight-bit ASCII format, which is then internally manipulated to create the digital Arabic numeral display as shown in FIGS. 2 and 3.

Microcomputer 50 is also connected to an optical receiver circuit 20, which is described in more detail in connection with FIG. 5. The optical receiver 20 is operative to receive optically transmitted data from the LED 16 of the receiver 10.

A timing and control circuit 55 is also operatively connected to microcomputer 50, and is operative to detect the actuation of push button switch S1 to begin operation of the microcomputer 50. A battery BT1 connected to the timing and control circuit 55 powers the display unit 12.

Figure 4:
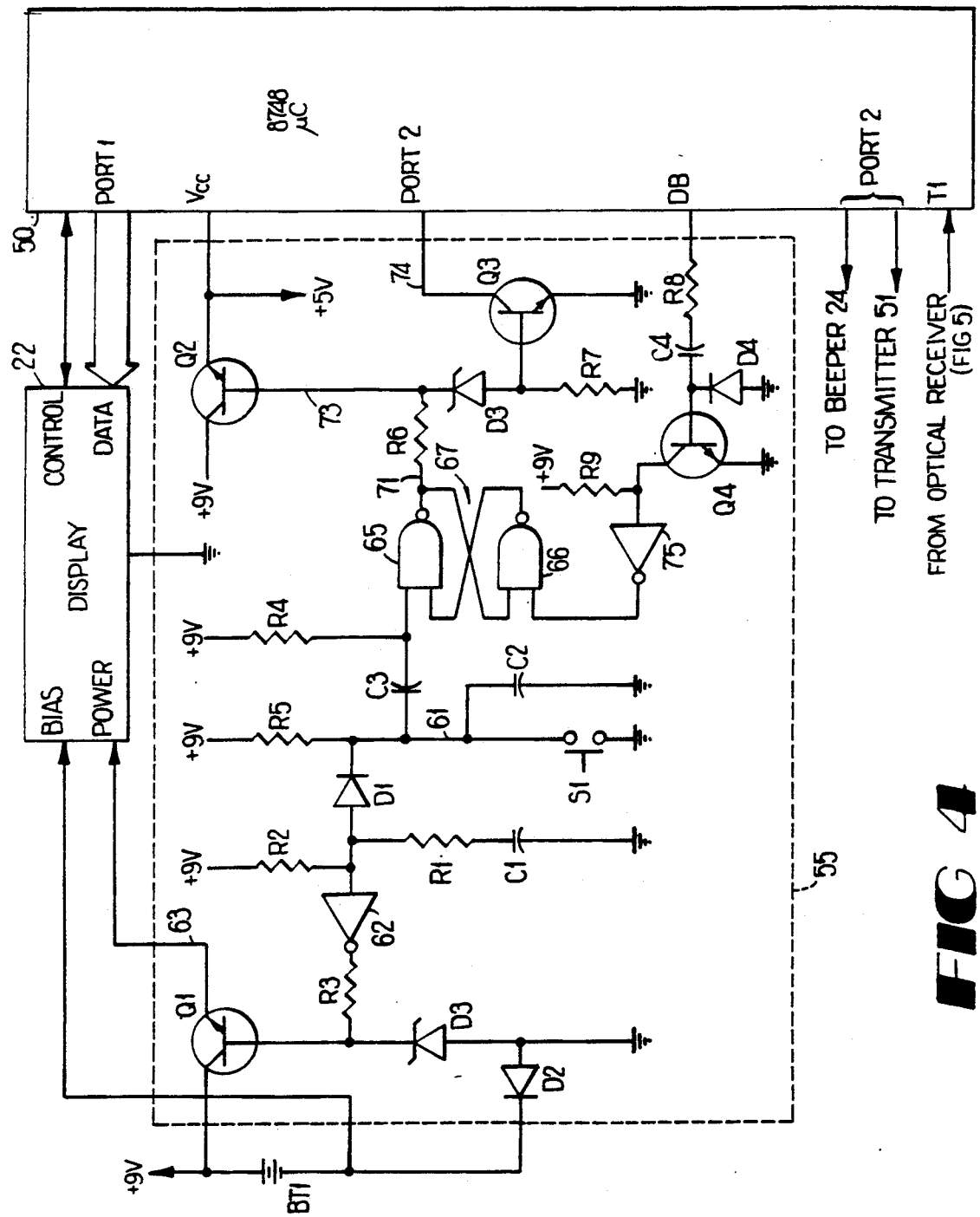
FIG. 4 is a schematic diagram of the timing and control circuit and other circuits in the transportable display unit illustrated in FIGS. 1-3.
Figure 6:
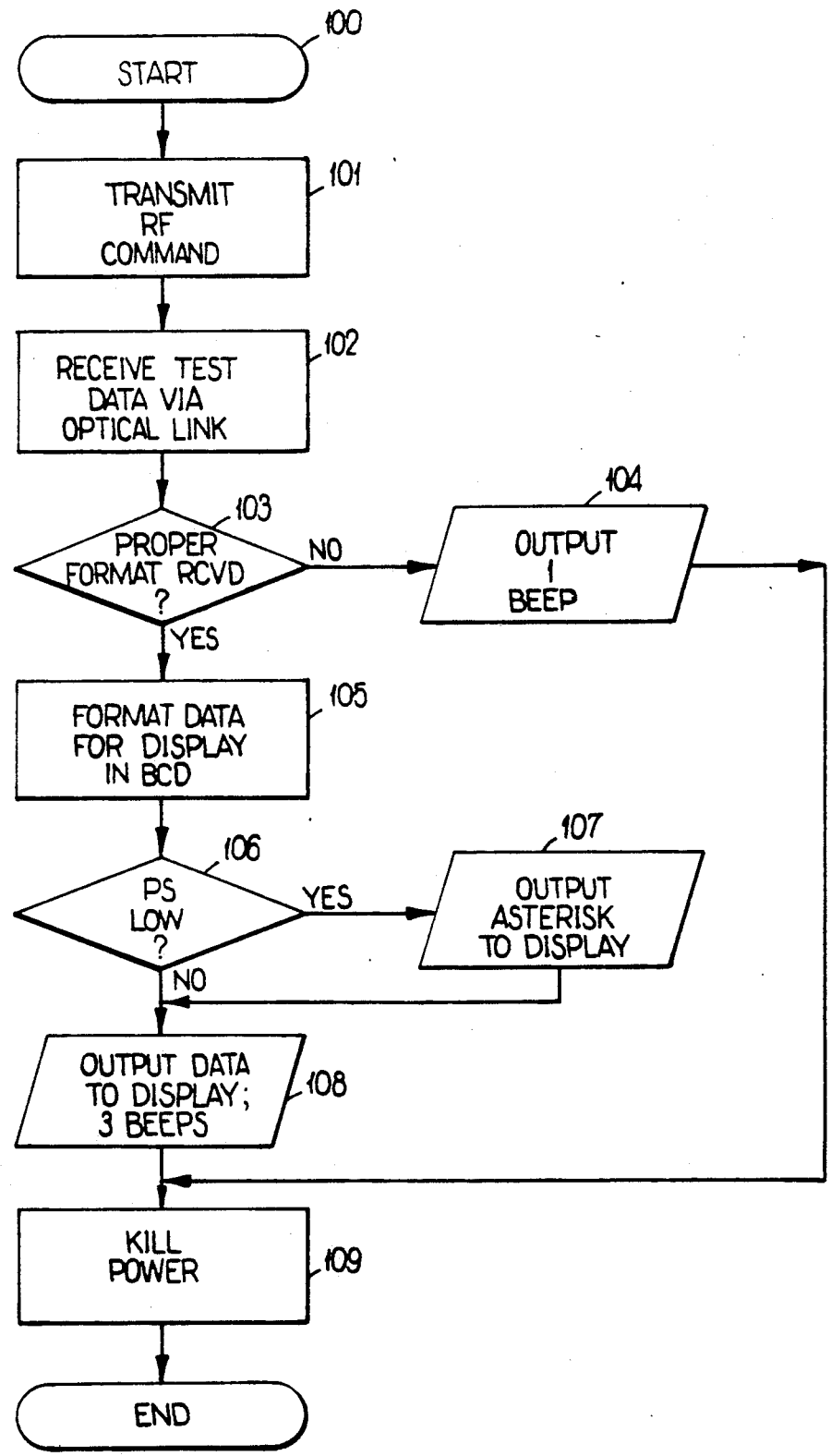
FIG. 6 is a flow chart diagram of the microcomputer program of the preferred embodiment of the transportable display unit.

Referring now to FIG. 4, the construction of the timing and control circuit 55 will be described in more detail. Actuation of the switch S1 controls the provision of power to the other components in the display unit, and causes the microcomputer 50 to begin execution of its program (the flow chart for the program of microcomputer 50 is illustrated in FIG. 6). When an operator depresses switch S1, ground potential is imposed at node 61 and provides a conduction path for capacitor C1 to discharge through resistor R1 and diode D1 to ground. Also, capacitor C2 discharges. Capacitor C1 is normally held charged through resistors R1, R2 by the battery BT1, which in the preferred embodiment is a conventional nine volt battery. Capacitor C1, after discharging, is recharged through resistor R2 at a time constant of about 30 seconds or more, to power down the circuitry as will be described below.

When capacitor C1 is discharged, a low will occur at the input of an inverter circuit 62, whose output is connected through a resistor R3 to the base of an NPN transistor Q1. Unless otherwise noted, all gates and the like employed in the preferred embodiment are CMOS to limit power consumption. Transistor Q1 then begins conducting, and allows power to be provided on line 63 to the POWER input of LCD display 22. The BIAS input of the display 22 is connected to the negative terminal of battery BT1, while the display ground is connected to the ground of the timing and control circuit 55.

Diode D2 connected between the negative terminal of battery BT1 and the ground plane of the timing and control circuitry 55 provides a negative potential to the BIAS input of the display 22 of approximately 0.7 volts below the ground potential of the timing and control circuit, which those skilled in the art will appreciate enhances the appearance of the liquid crystal display.

A zener diode D3 connected between the base of transistor Q1 and ground limits the voltage appearing at the base of transistor Q1.

The low appearing at node 61 from actuation of switch S1 also causes a low-going pulse to occur at one input of a NAND-gate 65. The low on node 61 is coupled to gate 65 through capacitor C3, which is quiescently held high through resistor R4. The output of NAND-gate 65 is connected to one input of a second NAND-gate 66, whose output is provided to the other input of NAND-gate 65 to form a latching circuit or flip-flop 67 known to those skilled in the art. The output of flip-flop 67 is provided on line 71 through a resistor R6 to node 73 and the base of an NPN transistor Q2. In the preferred embodiment, transistor Q2 is a Darlington transistor, the collector of which is connected to the nine-volt battery and the emitter of which is connected to the power supply $V_{cc}$ of the microcomputer 50. When a high appears at 71 when flip-flop 67 sets, transistor Q2 conducts, and provides power to the microcomputer.

The cathode of a 5.6 volt zener diode D3 is connected at a node 73 between the base of transistor Q2 and the base of another NPN transistor Q3, and limits the voltage appearing at the base of Q2. A resistor R7 is connected between the base of Q3, the anode of D3, and ground. As known to those skilled in the art, the preferred CMOS circuitry employed in the disclosed embodiment operates over a fairly wide voltage range, but the microcomputer 50 employed in the preferred embodiment, a type 8748 manufactured by Intel Corporation, Santa Clara, Calif., requires at least five volts for reliable operation. In the event that battery BT1 becomes weak so that the high provided at node 73 is insufficient to break down the zener, transistor Q3 will not conduct. Stated otherwise, so long as the voltage at 73 is sufficient to break down zener diode D3, the base of transistor Q3 will be biased, and Q3 will conduct.

The collector of transistor Q3 is connected to line 74, which is connected to one of the inport·ports, PORT 2, of the microcomputer 50, while the emitter is grounded. Thus, it will be appreciated that when transistor Q3 is on, a low will appear on line 74 at the PORT 2 input for sensing battery operation. In the event the microcomputer program detects a high on line 74, steps for signalling a "battery low" condition are executed.

The power-down operation of the microcomputer 50 is as follows. One of the data bus (DB) lines of microcomputer 50 is provided through a resistor R8 and capacitor C4 to the base of a NPN transistor Q4. The cathode of a diode D4 is connected also to the base of transistor Q4. The emitter of transistor Q4 is grounded, while the collector is pulled up to nine volts through resistor R9 and is connected to the input of an inverter circuit 75. The output of inverter 75 is connected to the remaining input of NAND-gate 66, the reset input of the flip-flop 67.

The power to microcomputer 50 remains until one of two occurrences: (1) the microcomputer 50 powers itself down, or (2) an RC network times out. In the first situation, microcomputer 50 will shut itself down at the conclusion of its program (as indicated in FIG. 6). The microcomputer places a low on the data bus line DB, which turns transistor Q4 off. With Q4 not conducting, the input to inverter 75 is high, placing a low at the input of the flip-flop 67, which drives the output of the flip-flop at line 71 low. If line 71 goes low, the bias from the base of transistor Q2 will be removed, and turn off power to the microcomputer.

The other mechanism for powering down the microcomputer is as follows. When microcomputer 50 begins its operation, the data bus line DB is brought high under program control, placing a bias at the base of transistor Q4, turning the transistor on and placing a low at the input of inverter 75. Those skilled in the art will understand that this provides a high to the input of the NAND-gate 66, which together with a high on line 71 keeps the flip-flop 67 set and transistor Q2 conducting. However, capacitor C4 will charge through resistor R8, and will subsequently remove the bias from transistor Q4, causing the transistor to turn off. It will thus be appreciated that this resets the flip-flop 67, and removes power from the microcomputer. In the preferred embodiment, the R8/C4 time constant, which is dependent on the beta of transistor Q4, is about 1-2 seconds, which allows ample time for the microcomputer to execute its program. It should also be noted that the power supply to the input $V_{cc}$ of microcomputer 50 is about five volts, due to the dual diode drops across the Darlington structure of transistor Q2, the voltage drop across the zener diode D3, and the base-emitter drop of transistor Q3.

In the preferred embodiment, microcomputer 50 is a type 8748 eight-bit microcomputer manufactured by Intel Corporation. It will be appreciated by those skilled in the art that other types of microcomputer circuits can be substituted for the microcomputer used in the preferred embodiment with equally satisfactory results. The type 8748 is particularly suitable for use in the present invention because it includes an ultraviolet-erasable programmable read-only memory for program storage, a 64×8 data memory, and an on-board timer/counter. Microcomputer 50 also includes a pair of bidirectional output ports, PORT 1 and PORT 2, which are eight-bit quasi-bidirectional data ports.

Still referring to FIG. 4, the eight lines of PORT 1 are provided to the data input of the display 22. It will be appreciated by those skilled in the art that the microcomputer 50 is operative to provide ASCII data to the display 22.

One of the PORT 2 lines is provided to beeper 24, shown in FIG. 3. It will be appreciated that microcomputer 50 can provide an audible signal to an operator by providing a signal on the selected PORT 2 line. Another of the PORT 2 lines is provided to the transmitter 51. It will also be appreciated that particular predetermined all-call or status inquiry command signal may be provided in digital form to the transmitter 51, which is responsive to transmit the encoded signal to the receiver.

Figure 5:
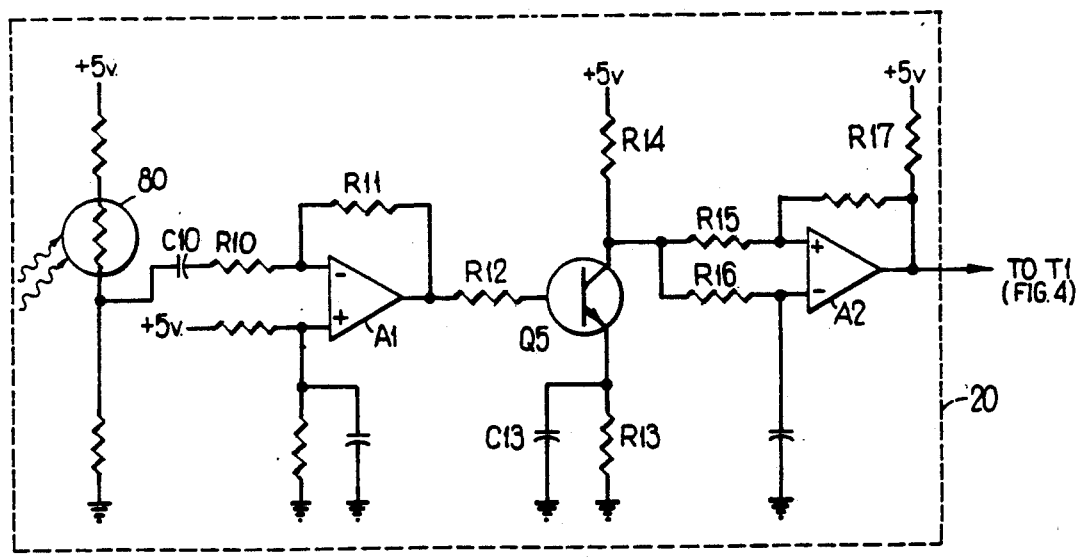
FIG. 5 is a schematic diagram of the optical receiver circuit in the preferred embodiment of the transportable display unit.

The optical receiver 20, illustrated in more detail in FIG. 5, is provided to the T1 test input of the microcomputer 50, shown in FIG. 4. It will be appreciated that the microcomputer receives the transmitted signals from the receiver 10 by monitoring the signal activity on the test input T1.

Referring now to FIG. 5, the optical receiver circuit 20 comprises a photoconductive cell 80 for detecting the light emitted by the LED 16 (FIG. 3). In the preferred embodiment, the photoconductive cell 80 is a cadmium sulfide photocell such as a type VT-721H manufactured by Vactec, Inc. of St. Louis, Mo. Those skilled in the art will appreciate that the preferred photoconductive cell has a wide dynamic range for high speed switching and operates satisfactorily in high ambient light.

The photoconductive cell 80 is biased by the five-volt power supply of the display unit 12, and voltage fluctuations caused by the detection of light are coupled through a capacitor C10 and resistor R10 to the inverting input of an operational amplifier A1. Capacitor C10 is preferably of a value to transmit the relatively high frequencies of the transmitted data from the load management receiver and to block 60 Hz power line interference which may be present. A feedback resistor R11 connected between the output of amplifier A1 and the inverting input provides a gain of about 100. Those skilled in the art will understand that the structure of amplifier A1 is conventional.

The output of amplifier A1 is provided through a resistor R12 to the base of an NPN transistor Q5. Transistor Q5 and its related components comprise a conventional common-emitter amplifier stage. The emitter of transistor Q5 is connected to ground through RC network R13, C13, while the collector is connected through resistor R14 to the five volt power supply.

The collector of Q5 is also connected through resistors R15, R16 to the inverting and noninverting inputs, respectively, of an amplifier A2 configured as a voltage comparator/Schmitt trigger. The output of amplifier A2 is fed back through resistor R17 to the noninverting input. Those skilled in the art will understand that the preferred configuration for amplifier A2 is to square-up input signals provided to it through the transistor Q5.

The output of amplifier A2 is provided to the test input T1 of the microcomputer 50 in FIG. 4.

In the preferred embodiment, the encoding scheme for data transmission from the load management receiver 10 to the hand-held display unit 12 is a bi-phase encoding format such as a Manchester code which allows transmission of a synchronized clock reference for the data to be transmitted together with the data. Inasmuch as bandwidth requirements are not of particular concern in the present invention, other types of encoding formats, such as frequency shift keying (FSK) or pulse width modulation (PWM), may also be used with equal sucess. The clock frequency of the microcomputer 50 should be high enough to insure that the program loop which tests the test input T1 for a high or low can properly detect and decode the Manchester code.

Figure 7:
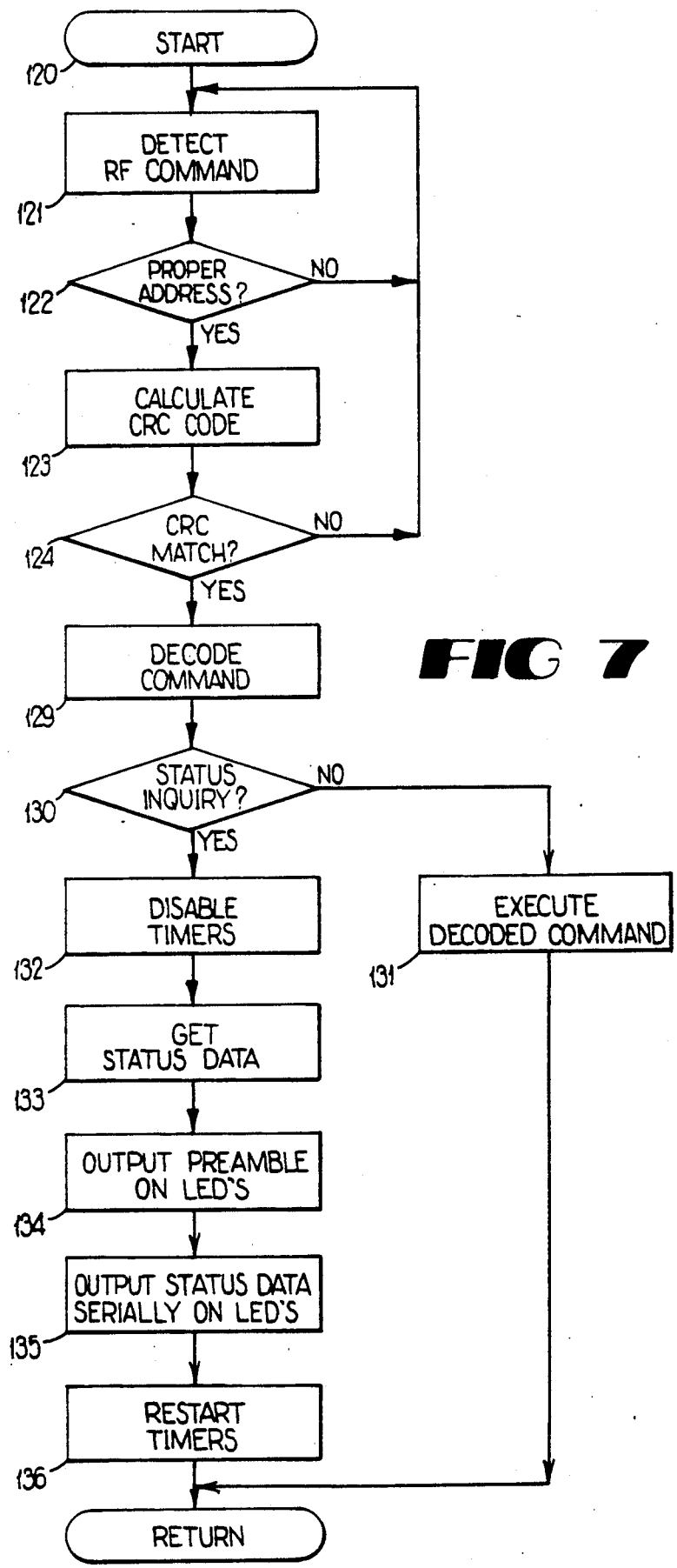
FIG. 7 is a flow chart diagram of the microcomputer program for the preferred embodiment of the load management receiver of the present invention.

Turning now to FIGS. 6 and 7, the general operation of the circuitry comprising the preferred embodiment will now be described. FIG. 6 is a flow chart diagram which illustrates a sequence of steps which may be embodied as a program for the microcomputer 50 in the display unit 12. Similarly, FIG. 7 is a flow chart diagram which illustrates a sequence of steps which may be embodied as a program for the microcomputer 35 in the load management receiver 10. Those skilled in the art will now understand and appreciate that apparatus as described herein for transmitting a predetermined status inquiry command signal from a display unit to a load management receiver, for causing the receiver to transmit encoded status data via a preexisting LED indicator, for receiving the transmitted status data and decoding same, and for displaying the decoded information in a format for an operator, may be constructed by circuits comprising digital and analog hardware, or by a preferred embodiment, as disclosed herein, using programmed microcomputers together with peripheral digital and analog circuitry.

It will be understood that the embodiment disclosed herein is merely illustrative and that the functional equivalents of the microcomputers 35, 50 may include other devices including digital hardware, firmware, or software, which are capable of performing the described functions and sequences in the present invention. It will be further appreciated that the microcomputers 35, 50 may be programmed to perform the steps illustrated in FIGS. 6 and 7.

Starting first with FIG. 6, there will be described the sequence of steps for operation of the display unit 12. The first step taken in the software for the microcomputer 50, shown at 100, is to start operation of the microcomputer 50. It should be understood that the operator of the display unit 12 will depress the switch S1, which causes power to be provided to the microcomputer 50. Those skilled in the art will appreciate that when power is provided to microcomputers such as the type 8748 employed in the preferred embodiment, a start-up or initialize routine is executed, which initializes and clears registers and begins operation of the program. After these initializing routines, typically taken at step 100, the predetermined status inquiry command signal is transmitted at 101.

It should further be understood that in normal operation, and as illustrated in FIG. 1, the optical receiver 20 of the display unit 12 is placed in close operative proximity to the LED 16 on the receiver 10 which is to be monitored or tested. The switch S1 is then depressed, and the optical receiver will then be conditioned to receive the optically transmitted data. This step is illustrated at 102 in FIG. 6.

At 103, the microcomputer executes a routine which attempts to decode the received information, it being understood that a Manchester code is expected in the preferred embodiment. It will be further understood that formatting information such as a header, a data stream, and finally a trailer such as a cyclic redundancy check (CRC) or other check bit scheme is employed in the preferred embodiment to insure that valid data is received from a light source. In the event that an improper format is detected by the microcomputer, the "NO" branch is followed to 104. The microcomputer 50 then causes the beeper 24 to emit a short single beep as an audible indication to the operator that for some reason valid data has not been received. Normally, at this point in the program, after the status inquiry command has been transmitted, the microcomputer will be expecting a properly encoded and formatted optically transmitted data stream, and if such a data stream is not detected, there is thereby provided an indication of a malfunction or other improper operation.

In the event that the proper data format is detected, the "YES" branch from 103 is followed to 105. At 105, the header and trailer information of the data is stripped, and the data received by the microcomputer separated and formatted for display on the display 22. As described above, this entails converting the received data into ASCII format for the display 22.

At 106, the microcomputer tests the PORT 2 input on line 74 to determine if the power supply battery is beginning to deteriorate. In the event that the power supply is detected as weak, the "YES" branch is followed to 107, and a single asterisk (*) is provided to the display 22 in addition to the data as described below. This provides a visual indication to the operator that the battery requires replacement.

In the event that the power supply is deemed adequate, or after an asterisk is output to the display as a weak battery indicator, step 108 is reached, and the now-formatted data is provided to the display 22. In the preferred embodiment, a series of three short beeps are also provided as an audible indication that the data is available for viewing and recording.

After either steps 104 or 108, the microcomputer 50 then at 109 provides a signal on the data bus line DB to cause power to be removed from the circuitry. The program then enters an endless loop, until power is removed via flip-flop 67 and transistor Q2. Power remains connected to the display 22 through transistor Q1 for a longer time period as previously described to allow observation of displayed data.

Referring now to FIG. 7, there will now be described the sequence of steps for the microcomputer 35 in the load management receiver 10. As described above in connection with FIG. 1, the microcomputer 35 is employed as the central controller for driving the isolation and relay drivers 40 to selectively remove loads from the electrical distribution system, to illuminate the LED 16, and to decode commands received from the RF receiver/demodulator 32. It should be understood that the microcomputer 35 in the disclosed embodiment, provided in the type DCU 1180 receiver, is preprogrammed to provide these decoding and control functions. These functions will not be described herein. However, in the preferred embodiment, the program for the microcomputer 35 is modified to make the microcomputer responsive to a particular predetermined status inquiry command signal to modulate the LED 16 to transmit retrieved status data. Accordingly, it will be understood that the program for the microcomputer 35 is altered to perform the sequence of steps illustrated in FIG. 7.

For purposes of describing FIG. 7, it should be further understood that the program therein illustrated in flow chart form may be implemented as an interrupt routine, a subroutine, or as part of the normal program flow for the microcomputer 35. For the discussion which follows, it will be assumed that the microcomputer 35 is normally operative to decode and execute commands transmitted to it by the main utility transmitter during normal operation, and to be responsive to execute certain of the steps of FIG. 7 only upon detection of a predetermined status inquiry command signal.

Starting at 120, after any initializing or stack-saving routines commonly executed in microcomputer programming, the microcomputer 35 is responsive to detect decoded digital signals being provided to it from the RF receiver/demodulator 32 (FIG. 3), at 121. The digital signals provided to the microcomputer are first compared to the preprogrammed address information at 122, to determine if the particular receiver unit is being addressed. If proper address information is not decoded, the program flow returns to 121, to await receipt of another RF command.

In the event that the microcomputer 35 detects that it is being addressed, the "YES" branch from 122 is followed to 123. At this step, the microcomputer is responsive to compute the cyclic redundancy check (CRC) data or other data integrity checking scheme. If a 124 the information received is improper, the program returns to 121. On the other hand, if the CRC is determined to be proper, the "YES" branch is followed to 129.

At 129, microcomputer 35 has now determined that it has been addressed, and that it has received a valid command due to the detection of a valid CRC test. At 130, the command received is compared to a special status inquiry command. If this command is not detected, microcomputer 35 then will execute the particular command received at 131, which will be one of the normal control or command functions provided by the receiver 10 in normal operation.

If the special status inquiry command signal has been received, however, then at 132 the microcomputer begins a sequence of steps which retrieves the status information from memory and transmits it through the optical data link, since the special status inquiry command signal in normal operation is only transmitted by a hand-held display unit 12. In order to accomplish these tasks, the microcomputer at 132 first disables any timers or other microcomputer features which might disrupt the communications transmission. At 133, the microcomputer retrieves from memory the status information described above. It will be recalled that in the preferred embodiment, this status information comprises the number of provisions of control functions F1-F4, a number of test transmissions received by the receiver, and the elapsed time since power loss or a provision of a reset command signal by the main utility transmitter. It will be understood that this status information has been prestored in a register of the microcomputer 35, or in an auxiliary memory provided for storage of this information.

After the status information has been retrieved, at 134 the microcomputer formats the information in a predetermined communications format receivable by the display unit 12. As those skilled in the art will understand, optical communications links typically comprise a preamble or series of digital signals which allow synchronization by the display unit 12 to receive the optically-transmitted data. In the preferred embodiment, it will be recalled that a Manchester code is employed, and that use of this or other bi-phase communications formats requires the transmission of a predetermined number of bits of synchronizing information.

Figure 8:
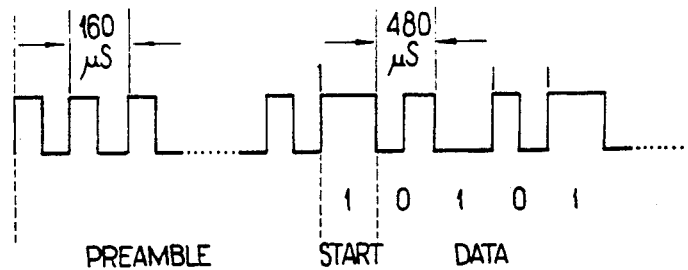
FIG. 8 is a timing diagram of the Manchester code data communications format employed in the preferred embodiment.

In the disclosed embodiment, and as illustrated in FIG. 8, the preferred communications format comprises a preamble of a predetermined number of preamble bits, fifty in the disclosed embodiment, each preamble bit having a bit of cycle time of 160 microseconds, followed by the data to be displayed. The data following the preamble is transmitted at a bit or cycle time of 480 microseconds, and the first or "start" bit is always a "1". The preamble bits allow time to synchronize the microcomputer (the preamble bits are thrown out), and to establish quiescent operating levels for the components in the optical receiver circuitry 20. As will be understood by those skilled in the art, the Manchester code illustrated in FIG. 8 is decoded by determining the presence or absence of a transition within the 480 microsecond cycle time, with the absence of a transition indicating a "1" and the presence of a transition indicating a "0". It will of course be understood that in FIG. 8 a low level indicates that LED 16 is not illuminated, while a high level indicates that the LED is lit. In radio switches having more than one LED, it will be further understood that a plurality of LEDs may be simultaneously modulated in parallel as described to obtain greater light output, and thus improve signal-to-noise ratios under some circumstances.

After provision of the preamble, the microcomputer 35 at step 135 transmits in serial fashion, in the above-described Manchester code format, the status information which has been previously retrieved. Also, at step 135, it should be understood that any CRC which may be added as trailer is computed and transmitted as well, so that the display unit 12 can verify receipt of the data.

At 136, the microcomputer 35 restarts the timer and restores any stack information which had been set aside prior to entry of the status inquiry command routine described herein. Then, the program returns to 120, or exits the interrupt or other subroutine employed to implement the herein-described status information transmission routine.

In a second preferred embodiment of the present invention, advantage is taken of the RF energy radiating characteristics of preexisting circuitry in the RF receiver/demodulator 32 in the receiver 10 to provide an RF data link for transmission of the retrieved status data. Those skilled in the art will understand that many conventional receiver circuits employ local RF oscillators in the demodulator circuitry to facilitate frequency conversion, and that stray RF signals emanating from these local oscillators can be detected for distances as great as several hundred feet from the receiver. In the second embodiment, advantage is taken of this stray radiating capability to create an RF data link for transmission of the status data from the receiver 10 to the hand-held display unit 12. The display unit accordingly is adapted such that the optical receiver 20 is replaced with an RF receiver/demodulator tuned to the frequency of the local oscillator to receive the data transmission.

Figure 9:
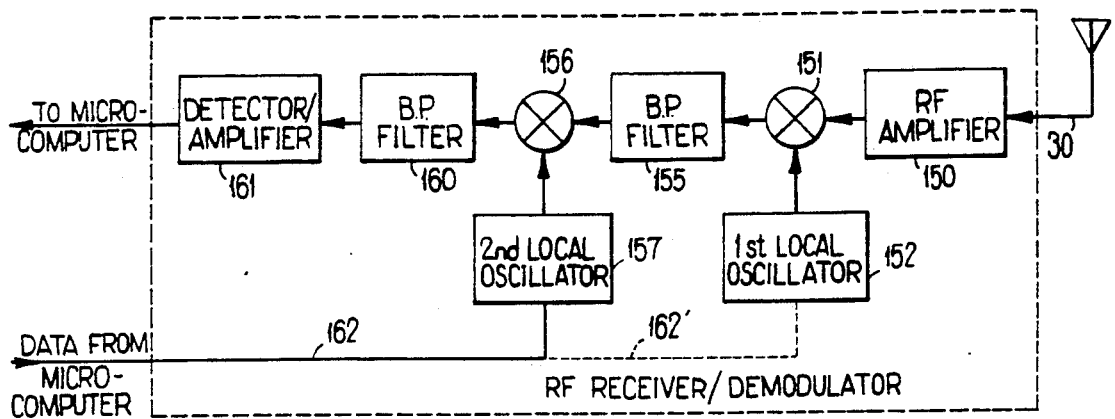
FIG. 9 is a schematic diagram of a typical RF receiver/demodulator which has been modified in accordance with a second embodiment of the present invention.

Referring now in particular to FIG. 9, there will now be described modifications to the receiver/demodulator 32 employed in the receiver 10. Typically, receiver circuits for use in receiver/demodulator 32 are double conversion type, the construction of which will be understood by those skilled in the art. Of course, it will be understood that other types of receiver circuits which have local oscillators that produce stray RF transmissions can also be employed with the modifications described herein.

In the receiver/demodulator 32 employed in the disclosed embodiment, the receiving antenna 30 is connected to an RF amplifier 150, the output of which is connected to a mixer 151. Also connected to the mixer 151 is a first local oscillator 152 which oscillates at a frequency of RF−10.7 MHz, where RF is the transmission frequency of the FM encoded command signals to the receiver. The output of the mixer 151 is then provided through a bandpass filter 155 to a second mixer 156, which mixes the signal with the output of a second local oscillator 157, which oscillates at a fixed frequency of 10.245 MHz. The output of the mixer 156 is then filtered by bandpass filter 160. It will be appreciated that the resultant frequency difference from the output of the second mixer 156 is 10.7−10.245=455 KHz, the standard AM intermediate frequency. Thus, bandpass filter 160 is preferably 455 KHz. The output of filter 160 is provided to a detector stage 161, the output of which is the digital data stream provided to the microcomputer 35.

Either the first oscillator 152 or the second oscillator 157 can be modified as described herein to utilize the oscillator as an RF signal source. Data from the microcomputer 35 is provided over a line 162 from the microcomputer to either the second local oscillator 157, or alternately to the first local oscillator 152 on line 162'.

It will also be understood that a separate dedicated third oscillator or transmitter could be provided in the receiver 10 for the specific purpose of providing an RF data link to the hand-held display unit 12.

Figure 10:
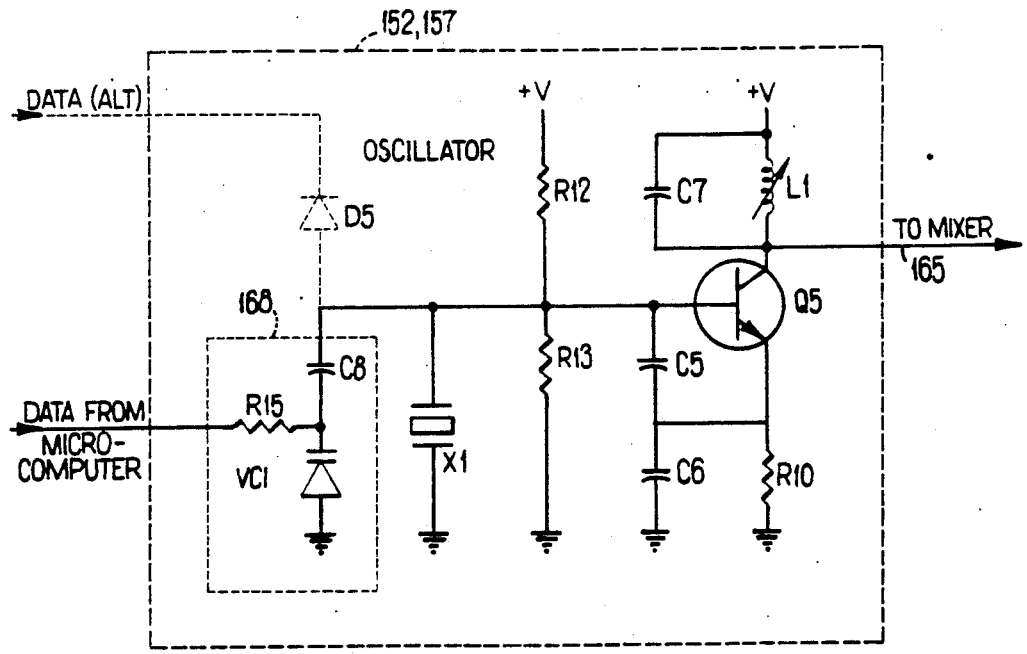
FIG. 10 is a schematic diagram of the modified local oscillator in the embodiment of FIG. 9.

FIG. 10 illustrates the modifications to a typical oscillator circuit 152 or 157, so as to modulate the oscillator to transmit data from the microcomputer to the display unit. First, it will be understood that without the use of shielding techniques, oscillators in receiver circuits radiate RF energy even without provision of a transmitting antenna. In most applications, there is no need to be concerned with the stray RF signal provided by such oscillators since the signal strength is only sufficient to be detected within a few hundred feet, and typically the frequencies are such that consumer electronic equipment will not be affected undesirably.

The oscillator 152, 157 illustrated in FIG. 10 comprises an NPN transistor Q5 as the active component, with a feedback path provided from the emitter through capacitor C5 to the base of the transistor Q5. Resistor R10 serves as a load resistor, while capacitor C6 filters higher frequency components to ground.

A crystal X1 is connected between ground and the base of transistor Q5 and is the prime frequency-determining component. A voltage divider comprising resistors R12, R13 provide biasing for the base of transistor Q5. An LC network comprising tunable coil L1 and capacitor C7 connected between the power rail and the collector of Q5 allows tuning of the oscillator's frequency.

The previously-described components constitute a conventional oscillator circuit. The modifications to FSK modulating the oscillator are enclosed within the dotted block 168. A varactor diode VC1 is connected between ground and through a capacitor C8 to the base of transistor Q5. C8 is selected to limit the frequency "pull" of the circuit and prevent operation at frequencies substantially above the selected frequency. Varactor diode VC1 allows the capacitive loading on the crystal X1 to be varied as a function of a control voltage.

The control voltage from the microcomputer is provided through a resistor R15 to the node between the varactor diode VC1 and the capacitor C8, and provides either a high or low voltage level to vary the capacitive loading to the crystal X1, thereby causing the crystal to oscillate at one of two selected frequencies.

The first oscillator 152, if modified to serve as the "transmitter", is commonly known as a "tripler" in that the circuit operates at three times the desired local oscillator frequency. The crystal X1 is selected on the order of 47 MHz, and the output of transistor Q5 at the collector is on the order of 141 MHz. The line 165 from the oscillator is the radiating element.

In the configuration illustrated, the radiated energy of the oscillator is strongest at the fundamental frequency of the crystal, namely, 47 MHz, and at related harmonics including 94 MHz and 141 MHz. It has been discovered that the signal strengths at the fundamental frequency and first two harmonics is sufficient for transmitting distances on the order of a few hundred feet. Thus, preferably the FM receiver in the hand-held display unit 12 is responsive to signals at either 47, 94 or 141 MHz.

In the case of the second or "fixed" local oscillator 157, which it will be recalled operates at 10.245 MHz, the signal at the collector of Q5 will be strongest at the fundamental frequency of the oscillator, that is, 10.245 MHz. Accordingly, the receiver in the display unit should be tuned to this frequency if the second oscillator is modified to serve as the "transmitter" for the data link.

It will be appreciated that the modulation technique described in the circuitry of FIGS. 9 and 10 is frequency-shifting (FSK) in that the oscillator 152, 157 is caused to shift between two frequencies, one of which represents a digital "0" and one of which represents a digital "1". It will be further understood that other modulation techniques can also be employed with equal success in the present invention, for example, amplitude modulation, phase modulation, audio frequency shifting (AFSK), or other techniques. However, it will be appreciated that the technique disclosed herein is particularly easy to implement since few modifications to the oscillator circuitry are required, in that only the components within the block 168 must be added to a conventional oscillator circuit in order to transform the oscillator into an FSK "transmitter".

Another alternative easy-to-implement modification to the oscillator 152, 157 is shown in dotted relief in FIG. 10 and comprises the addition of a diode D5 to the base of transistor Q5 to transform the oscillator into a continuous wave (CW) modulator, that is, on/off gating. It will be appreciated that by connecting the anode of the diode D5 to the base of transistor Q5, and providing a low or a high at the cathode from the microcomputer 35, the oscillator can be switched on or off to transmit data.

It will also be understood that other techniques for data transmission between the receiver 10 and the hand-held display unit 12 can be employed with equal success, for example sonic or ultrasonic techniques can be employed by connecting audible sound or ultrasonic transducers to be driven by the microcomputer 35 in the receiver 10, and by providing a corresponding receiver in the hand-held display unit 12. In addition, magnetic coupling can be successfully employed, for example, by providing a coil to create a time-varying electromagnetic field as the "transmitter", and a corresponding coil as the "receiver" in the display unit to which the field is coupled.

It will therefore be understood that other techniques may be employed to transmit commands from the display unit 12 to the receiver 10, for example, by substituting an optical, audio frequency, ultrasonic frequency, or other energy transmission device for the RF transmitter 51, and by providing a corresponding energy signal receiver circuit in the receiver 10. The important consideration is the provision of a bidirectional communications link between the display unit 12 and the receiver/remotely controllable switch 10 so that the receiver can be stimulated to retrieve prestored status data and transmit same to the display unit for display to the operator, without breaking or removing the utility seal or tag and without subjecting the operator of the display unit to electrical hazard through any hard-wiring techniques.

It should be specifically understood that some applications of the present invention will not require the use of the status inquiry command signal for stimulating the receiver 10 to transmit the retrieved status data. In many applications, the receiver 10 may be programmed to continuously and repetitively retrieve the status information and transmit same to the display unit 12.

Figure 11:
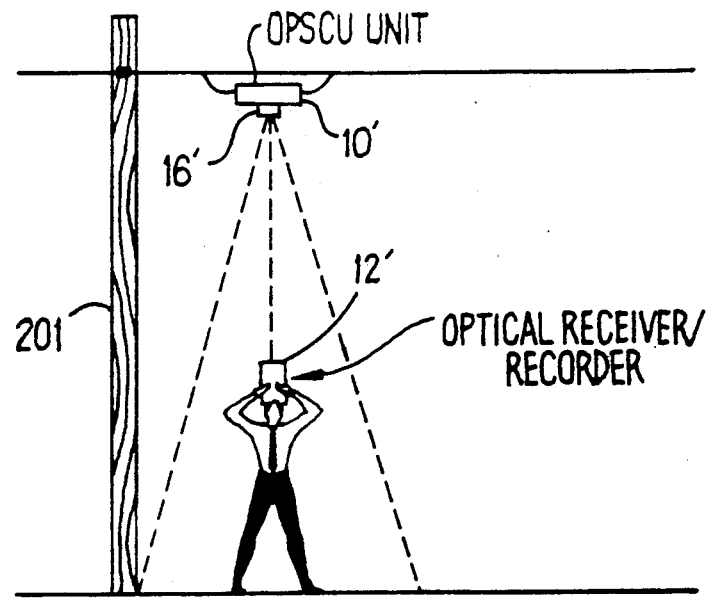
FIG. 11 illustrates the location of an off-premise subscriber control unit for a CATV distribution system incorporating the preferred embodiment of the present invention mounted on a utility pole.

Turning next to FIG. 11, there is illustrated another embodiment of a utility management receiver 10' configured for use in an outdoor subscriber control unit for a CATV signal distribution system. Those skilled in the art will understand that outdoor CATV subscriber control units may be of several types, for example an "off-premise" subscriber control unit is typically mounted off the subscriber's premises such as on a utility pole, and an "on-premise" subscriber control unit is typically located on the subscriber's premises such as on the side of the house. As in the case of an electrical load management system, a transportable receiver/recorder 12' with an optical data link is employed to receive the transmissions of the retrieved status data from the subscriber control unit/receiver 10', whether off-premise, on-premise, or otherwise.

In many CATV applications, the receiver 10' will often be mounted on a utility pole 201 and will therefore be inaccessible to a utility employee on the ground except by use of a bucket truck, by using a ladder, or by climbing the pole. Advantageously, the provision of status data from the subscriber control unit receiver 10' to the display unit 12' obviates climbing the pole and use of a bucket truck.

Alternatively, it will be understood that the subscriber control unit 10' may be mounted in a pedestal on the ground in some applications, or on the side of a subscriber's house for an on-premise unit. In cases such as these, a hole is provided in the pedestal or enclosure (not illustrated) so that the optically-transmitted data can be transmitted to the display unit 10'.

Accordingly, it will be appreciated that there are thereby provided several advantages by use of the present invention: greater safety for CATV personnel (since no climbing or sitting in traffic in a bucket truck is required), and higher productivity for CATV personnel. The higher productivity results from several factors. A greater number of subscriber control units may be inspected per hour, since the time required to receive the status data is nominal. There are cost savings since a bucket truck is not needed. If sufficient power levels are employed in the optical data link so that the range of transmission is sufficiently great, there may even be no need for an operator to physically approach close to the subscriber control unit. It is also possible that the status information may be received from within a vehicle on the ground; thus, inclement weather or inconvenient locations or environments (such as bad dogs) will be not delay or prevent receipt and display of the status information.

It will also be understood that security of the subscriber control unit 10' is of greater concern for on-premise subscriber control units, since the unit is more accessible to tampering. Accordingly, it will be appreciated that a security seal such as shown at 15 in FIG. 1 may also be employed for use in the subscriber control unit 10' to discourage and monitor tampering. It will also be appreciated that the difficulties encountered in units having such a security seal, and the advantages provided by the present invention, are the same for the CATV subscriber control 10' in FIG. 11 as for the receiver 10 in FIG. 1.

A conventionally constructed subscriber control unit is modified to incorporate the present invention by providing a diagnostic port for optical data transmission which will download or transmit status information from the subscriber control unit and, in one contemplated embodiment, up to four subscriber modules which are connected to and controlled by the subscriber control unit. The diagnostic port on the subscriber control unit is constructed as in the load management receiver application described above, with the provision of a data-transmitting LED 16' positioned behind a plastic lens or cover. In the preferred mode of operation, at predetermined time intervals, for example every several seconds, the control computer in the subscriber control unit (corresponding to the microcomputer 35 in FIG. 3) automatically enters a routine wherein the status information is retrieved from memory, formatted, and transmitted via the LED 16', in the manner described above in connection with the load management receiver.

As will be known to those skilled in the art, the function of an subscriber control unit (OPSCU) such as shown at 10' is to control the services provided by the cable system to a CATV subscriber. A subscriber control unit is addressable from a head end control computer (corresponding to the main utility transmitter 31 in FIG. 3), which transmits control signals via the CATV network, including address control information. Functions typically provided in a CATV subscriber control unit include but are not limited to the following functions:

1. The connection of subscribers for service or disconnection of subscribers who do not wish to continue service.

2. The control of service to multiple subscribers, for example four in one known prior art subscriber control unit.

3. The control of a pay per view/impulse pay per view (PPV/IPPV) type of subscriber service.

4. The jamming, scrambling, or trapping of the television signal carriers for particular subscribers so as to prevent the receipt of displayable signals by certain subscribers, for example subscribers who choose not to receive certain premium channels or subscribers who are physically connected to the network but who have not subscribed to the service.

5. The detection of intrusion into the subscriber control unit or into a subscriber module by a signal pirate and taking corrective action in response thereto, for example, by disconnecting or jamming the service to the port wherein the pirated signal is being misappropriated.

In order to monitor the operation of the OPSCU unit 10' which carries out some or all of the above utility management functions, it is necessary to store status information related to the provision of such functions, and provide means for transmitting and displaying same. For example:

1. The connection of subscribers for service or disconnection of subscribers who do not wish to continue service requires identification of a particular subscriber module connected to the subscriber control unit, as well as the number of and identification of any premium channels to be received by a particular subscriber.

2. The control of service to multiple subscribers requires identification of which subscriber module is connected to which subscriber.

3. The control of a pay per view/impulse pay per view (PPV/IPPV) type of subscriber service requires subscriber identification and timing information for billing purposes.

4. The jamming, scrambling, or trapping of the television signal carriers for particular subscribers so as to prevent the receipt of displayable signals by certain subscribers requires identification of which channels are to be jammed, for which subscriber modules.

5. The detection of intrusion into the subscriber control unit or into a subscriber module by a signal pirate should be signalled to the utility so that the corrective action can be taken or further, follow-up action instituted.

6. The status of the power supply to the subscriber control unit for home-powered units.

7. The storage, retrieval, and formatting for transmission for display of an output of status information to a CATV support worker.

In preferred CATV embodiments, the OPSCU unit 10' will be provided with memory as in the case of the load management receiver described above, for storing predetermined status information such as the identification and number of channels being provided to a particular subscriber, the number and identification of channels being trapped for particular subscribers, whether or not a security breach has occurred, the number of subscriber modules present and being controlled by the subscriber control unit, the occurrence of any equipment failures including total failure, the connect/disconnect status of subscribers to the CATV system, information regarding PPV/IPPV if implemented, and the status of home power supplies for subscriber control units which are powered by the electrical systems of a particular subscriber.

As in the case of the load management receiver discussed above, the retrieved status information is transmitted serially and modulated in a predetermined communications format. The status information is stored in non-volatile memory in the subscriber control unit 10'. The stimulus that causes the data stream to be transmitted in one embodiment is a timed pulse from the microprocessor controlling the subscriber control unit (which corresponds to the microcomputer 35 in the receiver 10 described above in connection with FIG. 3), or alternatively, the predetermined status inquiry signal described above. For example, a radio transmission or optical signal from the display unit 12' can cause the retrieval and transmission of the stored information, in the manner described above in connection with the status inquiry command signal for the load management receiver.

Embodiments which employ means for transmitting the status inquiry command signal via either light pulses or radio waves will entail slightly more expense in that a photodetector and supporting circuitry (corresponding to the optical receiver 20 in FIG. 3) will be required for the receiver 10', but such an embodiment conserves power since there is no need to repetitively and continuously transmit the status information. In addition, use of the status inquiry command to stimulate data transfer allows faster access to the status information, since the CATV worker with the display unit need not wait until the predetermined time for next automatic transmission of the status information.

Figure 12:
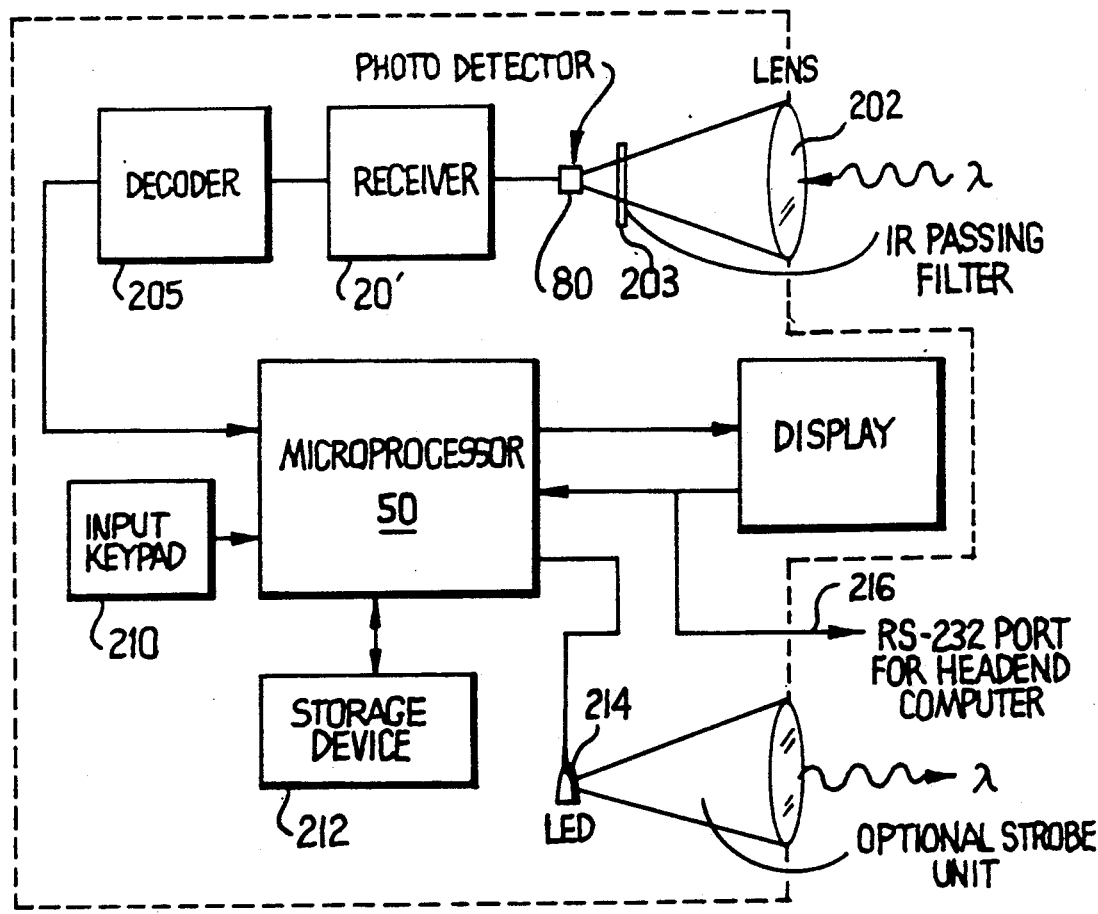
FIG. 12 is a block schematic diagram of a CATV subscriber control unit constructed in accordance with the preferred embodiment of the present invention.

FIG. 12 illustrates an alternative embodiment for the transportable display unit 12' specifically for use in CATV management applications. It is used by a CATV maintenance or installation technician to gather the status information and display same. The display unit 12' comprises a lens 202 for focusing received optical energy onto an infrared wavelenth photodetector 80, which is a part of an optical receiver circuit 20' constructed as described above in connection with the receiver 20 in FIG. 5. An infrared passing filter 203 eliminates unwanted external light from the photodetector. The lens 202 is provided for increasing the optical sensitivity of the receiver 20' and for overcoming the effect of any dirt accumulation on the housing of the LED 16' in the subscriber control unit 10'. The lens and filter also allows rejection of unwanted lights such as sunlight and light from street lights.

The microprocessor 50, as in the load management receiver embodiment described above, is responsive to signals provided by the receiver 20' to demodulate the transmitted status information from the communications format. Alternatively, a separate decoder 205 may be employed for demodulating and decoding the status information from the predetermined communications format.

An input keypad 210 is connected to a port of the microprocessor 50 and allows the prompting of the device for formatting of data being displayed on a display 22', which corresponds to the display 22 shown above in FIG. 2. In addition, the input keypad 210 can be used to allow operator input of the number of a particular control unit/receiver 10' being polled, in the case of no response or mistaken identity. For example, it will be understood that each of the subscriber control units 10' is responsive to a predetermined address from the head end computer, and in embodiments which include provision for stimulation by a status inquiry command, the particular address or a global or "scram" address may be employed to provide further stimulation to the subscriber control unit 10' in the event that a malfunction is suspected.

A memory or storage device 212, comprising volatile or non-volatile memory circuits, is provided for storing retrieved status information for display, and for possible later downloading to another computer system. In addition, a bulk storage device such as a cassette tape drive (not shown) may be provided for collection of large amounts of data from many subscriber control units for later computer analysis and evaluation. An RS-232 port 216 is provided for the purpose of connection for downloading or to a bulk storage device.

The microcomputer 50 is optionally connected to an LED optical transmitter or a strobe unit 214 to allow transmission of optical signals for providing the status inquiry command to the subscriber control unit 10'. In such applications, the LED or strobe unit 214 corresponds to the RF transmitter 51 described above in connection with FIG. 3 for transmission of the status inquiry command.

It will be appreciated that if a strobe unit is employed, the optical detector in the subscriber control unit 10' (which corresponds to the receiver/demodulator 32 in FIG. 3) can be relatively "numb" or optically insensitive so as to simplify the circuitry and make it less expensive. Construction of such a "numb" optical receiver is within the skill of the art, and will be understood to comprise an optical receiver which is responsive to one or more intense flashes of light (but not to sunlight or other light sources) to cause the microcomputer 35 to enter appropriate routines for retrieving and transmitting the stored status data.

The preferred embodiments of the present invention have been disclosed by way of example and it will be understood that other modifications may occur to those skilled in the art without departing from the scope and the spirit of the appended claims.

What is claimed is:

1. In a utility management system, said system including means for transmitting address signals for directing commands to utility management receivers and coded command signals for controlling actions to be taken by an addressed one of said utility management receivers, an improved utility management receiver for controlling actions and for transmitting status data obtained during operation of said receiver for display, comprising:

address decoding means responsive to said address signals for determining whether said receiver has been addressed to receive a command;

means for decoding said coded command signals in response to said address decoding means determining that said receiver has been addressed, said coded command signals including an utility function command;

means responsive to said utility function command for carrying out a utility function;

memory means for storing said status data related to a plurality of parameters of operation of said receiver;

means for retrieving said status data for said memory means;

formatting means for arranging said retrieved status data in a predetermined communications format;

data transmitting means for transmitting data in said communications format; and display control means operative for causing said data transmitting means to transmit said retrieved status data in said communications format to an external location for display.

2. The improved receiver of claim 1, wherein said coded command signals include a status inquiry command, and wherein said status data retrieving means is responsive to said status inquiry command for retrieving said status data from said memory means.

3. The improved receiver of claim 1, wherein said utility is an electrical power utility, and wherein said receiver is a load management receiver.

4. The improved receiver of claim 3, wherein said utility function is a load reduction function, and wherein said load management receiver is operative to disconnect an electrical load from said electrical power utility in response to a load reduction command.

5. The improved receiver of claim 1, wherein said utility is a cable television utility, and wherein said receiver is a subscriber control unit.

6. The improved receiver of claim 5, wherein said utility function comprises a function related to the operation of said subscriber control unit, including but not limited to disconnecting a subscriber from said cable television utility, controlling a plurality of subscriber modules connected to said subscriber control unit, jamming carrier signals to prevent receipt of television signals by a subscriber module, controlling a pay per view mode of operation of a subscriber module, detecting an intrusion into a subscriber module or into said subscriber control unit by a signal pirate, or providing said retrieved status data for display to an operator.

7. The improved receiver of claim 5, wherein said status data comprises data related to the operation of said subscriber control unit, including but not limited to the number or identification of channels being scrambled for a particular subscriber, the number or identification of subscriber modules presently being controlled by said subscriber control unit, whether or not a security breach has occurred at said subscriber control unit, the number or identification of any equipment failures detected by said subscriber control unit, the number or identification of any premium channels being received by a particular subscriber, or billing information for operation of said subscriber control unit or a subscriber module in a pay per view mode.

8. The receiver of claim 1, wherein said data transmitting means comprises optical data transmitting means.

9. The receiver of claim 1, wherein said data transmitting means comprises radio frequency data transmitting means.

10. In a utility management system, said system including means for communicating coded command signals for causing the execution of a utility function and a remotely located receiver for executing said utility function, said receiver including means for decoding said coded command signals and means responsive to decoded command signals for executing said utility function, an improved status display for said receiver, comprising:

memory means for storing status data related to a parameter of operation of said receiver;

means for retrieving said stored status data from said memory means;

formatting means for arranging said retrieved status data in a predetermined optical communications format;

optical data transmitting means for transmitting said retrieved status data in said predetermined optical communications format;

display control means operative for causing said optical data transmitting means to transmit said retrieved status data in said predetermined optical communications format;

an electrically independent free standing portable display unit separate from said receiver including means for receiving status data transmitted by said optical data transmitting means; and means for displaying said received status data on a display associated with said portable display unit.

11. The improvement of claim 10, wherein said coded command signals include a predetermined status inquiry command signal, further comprising means associated with said portable display unit for transmitting said predetermined status inquiry command signal to said receiver, and wherein said retrieving means is responsive to said predetermined status inquiry command signal for retrieving said status data from said memory means.

12. The improvement of claim 11, wherein said coded command signals comprise address data and command data, wherein each of said receivers is responsive to command data only for particular predetermined address data, and wherein said predetermined status inquiry command signal transmitted by said portable display unit comprises universal address data, whereby each of a plurality of said receivers is responsive to said predetermined status inquiry command signal.

13. The improvement of claim 10, wherein said utility is an electrical power utility, and wherein said receiver is a load management receiver.

14. The improvement of claim 13, wherein said utility function is a load reduction function, and wherein said load management receiver is operative to disconnect an electrical load from said electrical power utility in response to a load reduction command.

15. The improvement of claim 10, wherein said utility is a cable television utility, and wherein said receiver is a subscriber control unit.

16. The improvement of claim 15, wherein said utility function comprises a function related to the operation of said subscriber control unit, including but not limited to disconnecting a subscriber from said cable television utility, controlling a plurality of subscriber modules connected to said subscriber control unit, jamming carrier signals to prevent receipt of television signals by a subscriber module, controlling a pay per view mode of operation of a subscriber module, detecting an intrusion into a subscriber module or into said subscriber control unit by a signal pirate, or providing said retrieved status data for display to an operator.

17. The improvement of claim 15, wherein said status data comprises data related to the operation of said subscriber control unit, including but not limited to the number or identification of channels being scrambled for a particular subscriber, the number or identification of subscriber modules presently being controlled by said subscriber control unit, whether or not a security breach has occurred at said subscriber control unit or at a subscriber module, the number or identification of any equipment failures detected by said subscriber control unit, the number or identification of any premium channels being received by a particular subscriber, or billing information for operation of said subscriber control unit or a subscriber module in a pay per view mode.

18. The improvement of claim 10, wherein said portable display unit comprises:
    display unit optical receiver means for receiving said formatted status data; and
    means for converting said received formatted status data into a format for display to an operator on said displaying means.

19. In a method for controlling a utility management system, said system including means for communicating address signals for directing commands to particular utility management receivers and coded command signals, and remotely located receivers for executing utility management functions, a method of monitoring and testing said receivers, comprising the steps of:
    decoding the address signals at the receiver for determining whether the receiver has been addressed to receive a command;
    executing a utility function in response to a utility function command signal when the receiver is determined to have been addressed to receive a command;
    providing a memory in the receiver for storing a plurality of parameters of operation of the receiver;
    storing in the memory status data related to a parameter of operation of the receiver in response to the execution of a command by the receiver;
    retrieving the status data from the memory at predetermined times;
    formatting the retrieved status data in a format for display on a display means; and
    displaying said formatted status data on the display means.

20. The method of claim 19, further comprising the step of determining whether the coded command signals correspond to a utility function command or a status inquiry command, and wherein the step of retrieving said status data from said memory is executed in response to the status inquiry command.

21. The method of claim 19, wherein the utility is an electrical power utility, and wherein the receiver is a load management receiver.

22. The method of claim 21, wherein the utility function is a load reduction function, and wherein the load management receiver is operative to disconnect an electrical load from the electrical power utility in response to a load reduction command.

23. The method of claim 19, wherein the utility is a cable television utility, and wherein the receiver is a subscriber control unit.

24. The method of claim 23, wherein the utility function comprises a function related to the operation of the subscriber control unit, including but not limited to disconnecting a subscriber from the cable television utility, controlling a plurality of subscriber modules connected to the subscriber control unit, jamming carrier signals to prevent receipt of television signals by a subscriber module, controlling a pay per view mode of operation of a subscriber module, detecting an intrusion into a subscriber module or into the subscriber control unit by a signal pirate, or providing the retrieved status data for display to an operator.

25. The method of claim 23, wherein the status data comprises data related to the operation of the subscriber control unit, including but not limited to the number or identification of channels being scrambled for a particular subscriber, the number or identification of subscriber modules presently being controlled by the subscriber control unit, whether or not a security breach has occurred at the subscriber control unit or at a subscriber module, the number or identification of any equipment failures detected by the subscriber control unit, the number or identification of any premium channels being received by a particular subscriber, or billing information for operation of the subscriber control unit or a subscriber module in a pay per view mode.

26. The method of claim 19, wherein the steps of formatting the retrieved status data for display and displaying the formatted status data comprises the steps of:
    formatting the retrieved status data in a predetermined communications format;
    transmitting the formatted status data to a separate display unit with data transmitting means;
    receiving the formatted status data at the separate display unit; and
    displaying the status data on a display associated with the display unit.

27. The method of claim 26, wherein the step of transmitting the formatted status data comprises transmitting with optical data transmitting means.

28. In a utility management system, said system including a remotely located receiver responsive to a transmitted coded command signal for executing a utility function, a receiver monitoring and testing apparatus, comprising:
- memory means associated with said receiver for storing status data related to a parameter of operation of said receiver;
- means associated with said receiver for retrieving said status data from said memory means;
- means associated with said receiver for transmitting said retrieved status data in a predetermined communications format; and
- a transportable display unit for displaying said status data to an operator, comprising:
- means for receiving said transmitted status data from said receiver transmitting means;
- a data display associated with said transportable display unit and positioned for viewing by said operator;
- means for converting said received status data into a format for display on said data display to an operator;
- means for displaying said formatted status data on said data display.

29. The apparatus of claim 28, wherein said coded command signals include a status inquiry command, and wherein said status data retrieving means is responsive to said status inquiry command for retrieving said status data from said memory means.

30. The apparatus of claim 28, wherein said utility is an electrical power utility, and wherein said receiver is a load management receiver.

31. The apparatus of claim 30, wherein said utility function is a load reduction function, and wherein said load management receiver is operative to disconnect an electrical load from said electrical power utility in response to a load reduction command.

32. The apparatus of claim 28, wherein said utility is a cable television utility, and wherein said receiver is a subscriber control unit.

33. The apparatus of claim 32, wherein said utility function comprises a function related to the operation of said subscriber control unit, including but not limited to disconnecting a subscriber from said cable television utility, controlling a plurality of subscriber modules connected to said subscriber control unit, jamming carrier signals to prevent receipt of television signals by a subscriber module, controlling a pay per view mode of operation of a subscriber module, detecting an intrusion into a subscriber module or into said subscriber control unit by a signal pirate, or providing said retrieved status data for display to an operator.

34. The apparatus of claim 32, wherein said status data comprises data related to the operation of said subscriber control unit, including but not limited to the number or identification of channels being scrambled for a particular subscriber, the number or identification of subscriber modules presently being controlled by said subscriber control unit, whether or not a security breach has occurred at said subscriber control unit, the number or identification of any equipment failures detected by said subscriber control unit, the number or identification of any premium channels being received by a particular subscriber, or billing information for operation of said subscriber control unit or a subscriber module in a pay per view mode.

35. The apparatus of claim 28, wherein said receiver transmitting means comprises optical data transmitting means, and said portable display unit receiving means comprises optical data receiving means.

36. A transportable display apparatus for receiving status information transmitted from a utility management system receiver and displaying same to an operator, said status information comprising information related to a parameter of operation of said utility management system receiver, comprising:
- means for receiving status data transmitted by said utility management system receiver;
- means for converting said received status data into a format for display to an operator;
- means for displaying to an operator a visual display of said received status data;
- memory means for storing said received status data for later recall; and
- output means for retrieving said received status data from said memory means and for providing said received status data as an output.

37. In a utility management system, said system including means for communicating coded command signals for causing the execution of a utility function and a remotely located receiver for executing said utility function, said receiver including means for decoding said coded command signals and means responsive to decoded command signals for executing said utility function,
an improved status display for said receiver, comprising:
- said coded command signals including a predetermined status inquiry command signal;
- said coded command signals comprising address data and command data;
- said receiver being responsive to command data only for particular predetermined address data;
- memory means for storing status data related to a parameter of operation of said receiver;
- means for retrieving said stored status data from said memory means in response to said predetermined status inquiry command signal;
- formatting means for arranging said retrieved status data in a predetermined optical communications format;
- optical data transmitting means for transmitting said retrieved status data in said predetermined optical communications format;
- display control means operative for causing said optical data transmitting means to transmit said retrieved status data in said predetermined optical communications format;
- an electrically independent portable display unit separate from said receiver including means for receiving status data transmitted by said optical data transmitting means;
- means associated with said portable display unit for transmitting said predetermined status inquiry command signal to said receiver;
- said predetermined status inquiry command signal transmitted by said portable display unit comprising universal address data, each of a plurality of said receivers being responsive to said predetermined status inquiry command signal; and
- means for displaying said received status data on a display associated with said portable display unit.

38. The improvement of claim 37, wherein said utility is an electrical power utility, and wherein said receiver is a load management receiver.

39. The improvement of claim 38, wherein said utility function is a load reduction function, and wherein said load management receiver is operative to disconnect an electrical load from said electrical power utility in response to a load reduction command.

40. The improvement of claim 37, wherein said utility is a cable television utility, and wherein said receiver is an off-premise subscriber control unit.

41. The improvement of claim 40, wherein said utility function comprises a function related to the operation of said off-premise subscriber control unit, including but not limited to disconnecting a subscriber from said cable television utility, controlling a plurality of subscriber modules connected to said off-premise subscriber control unit, jamming carrier signals to prevent receipt of television signals by a subscriber module, controlling a pay per view mode of operation of a subscriber module, detecting an intrusion into a subscriber module or into said off-premise subscriber control unit by a signal pirate, or providing said retrieved status data for display to an operator.

42. The improvement of claim 40, wherein said status data comprises data related to the operation of said off-premise subscriber control unit, including but not limited to the number or identification of channels being scrambled for a particular subscriber, the number or identification of subscriber modules presently being controlled by said off-premise subscriber control unit, whether or not a security breach has occurred at said off-premise subscriber control unit or at a subscriber module, the number or identification of any equipment failures detected by said off-premise subscriber control unit, the number or identification of any premium channels being received by a particular subscriber, or billing information for operation of said off-premise subscriber control unit or a subscriber module in a pay per view mode.

43. The improvement of claim 37, wherein said portable display unit comprises:
   display unit optical receiver means for receiving said formatted status data; and
   means for converting said received formatted status data into a format for display to an operator on said displaying means.

* * * * *

UNITED STATES PATENT AND TRADEMARK OFFICE
CERTIFICATE OF CORRECTION

PATENT NO. : 5,099,348
DATED : March 24, 1992
INVENTOR(S) : Paul M. Huddleston, et. al.

It is certified that error appears in the above-indentified patent and that said Letters Patent is hereby corrected as shown below:

On the Title page, item [75], Inventors: should be as follows--

Paul M. Huddleston, Stone Mountain, GA; Glenn A. Davis, Lilburn, GA;

Thomas H. Williams, Doraville, GA.--

Signed and Sealed this

Nineteenth Day of October, 1993

*Attest:*

BRUCE LEHMAN

*Attesting Officer*     *Commissioner of Patents and Trademarks*